United States Patent
Shklover et al.

(10) Patent No.: US 11,681,236 B2
(45) Date of Patent: Jun. 20, 2023

(54) METHOD FOR IN-SITU DYNAMIC PROTECTION OF A SURFACE AND OPTICAL ASSEMBLY

(71) Applicant: Carl Zeiss SMT GmbH, Oberkochen (DE)

(72) Inventors: Vitaliy Shklover, Heidenheim (DE); Jeffrey Erxmeyer, Oberkochen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 17/373,020

(22) Filed: Jul. 12, 2021

(65) Prior Publication Data
US 2021/0341848 A1 Nov. 4, 2021

Related U.S. Application Data

(63) Continuation of application No. PCT/EP2019/083764, filed on Dec. 5, 2019.

(30) Foreign Application Priority Data

Jan. 10, 2019 (DE) ........................ 102019200208.0

(51) Int. Cl.
*G03F 7/20* (2006.01)
*G03F 7/00* (2006.01)

(52) U.S. Cl.
CPC ...... *G03F 7/70958* (2013.01); *G03F 7/70891* (2013.01); *G03F 7/70916* (2013.01); *G03F 7/70983* (2013.01)

(58) Field of Classification Search
CPC ............. G03F 7/70958; G03F 7/70891; G03F 7/70916; G03F 7/70983; G03F 7/70933; G01N 21/15; G01N 21/9501; G02B 1/14
See application file for complete search history.

(56) References Cited

U.S. PATENT DOCUMENTS 6,466,365 B1  10/2002  Maier et al.
6,824,930 B1  11/2004  Wheland et al.
(Continued)

FOREIGN PATENT DOCUMENTS

DE  10209493 A1  10/2003
DE  10321103 A1  12/2004
(Continued)

OTHER PUBLICATIONS

Chow et al, Journal of Applied Polymer Science vol. 13, (1969), pp. 2325-2332.
(Continued)

*Primary Examiner* — Mesfin T Asfaw
(74) *Attorney, Agent, or Firm* — Edell, Shapiro & Finnan, LLC

(57) ABSTRACT

In situ dynamic protection of an optical element surface against degradation includes disposing the optical element in an interior of an optical assembly for the FUV/VUV wavelength range and supplying at least one volatile fluorine-containing compound (A, B) to the interior for dynamic deposition of a fluorine-containing protective layer on the surface. The protective layer (7) is deposited on the surface layer by layer via a molecular layer deposition process. The compound includes a fluorine-containing reactant (A) supplied to the interior in a pulsed manner. A further reactant (B) is supplied to the interior also in a pulsed manner. An associated optical assembly includes an interior in which a surface is disposed, and at least one metering apparatus (123) that supplies a reactant to the interior. The metering apparatus provides a pulsed supply of the compound as a reactant (A, B) for layer by layer molecular layer deposition.

15 Claims, 2 Drawing Sheets

(56) References Cited

U.S. PATENT DOCUMENTS

| | | |
|---|---|---|
| 6,833,949 B2 | 12/2004 | Maier et al. |
| 6,872,479 B2 | 3/2005 | Maier et al. |
| 7,128,984 B2 | 10/2006 | Maier et al. |
| 7,300,743 B2 | 11/2007 | French et al. |
| 7,402,377 B2 | 7/2008 | French et al. |
| 7,438,995 B2 | 10/2008 | French et al. |
| 8,399,110 B2 | 3/2013 | Cangemi et al. |
| 2003/0021015 A1 | 1/2003 | Maier et al. |
| 2004/0006249 A1 | 1/2004 | Hoshino et al. |
| 2004/0202225 A1 | 10/2004 | Maier et al. |
| 2005/0023131 A1 | 2/2005 | Takaki |
| 2005/0104015 A1 | 5/2005 | Wedowski et al. |
| 2005/0120953 A1 | 6/2005 | Banine et al. |
| 2005/0271893 A1 | 12/2005 | Kobrin et al. |
| 2006/0046099 A1 | 3/2006 | Maier et al. |
| 2006/0171438 A1 | 8/2006 | Maier |
| 2007/0054497 A1 | 3/2007 | Weiss et al. |
| 2007/0108161 A1* | 5/2007 | Murugesh ........... C23C 16/4404 118/726 |
| 2011/0188011 A1 | 8/2011 | Ehm et al. |
| 2012/0121932 A1 | 5/2012 | George et al. |
| 2017/0212433 A1 | 7/2017 | Ehm et al. |
| 2020/0064748 A1 | 2/2020 | Forcht et al. |

FOREIGN PATENT DOCUMENTS

| | | |
|---|---|---|
| DE | 10350114 B4 | 1/2006 |
| DE | 102006004835 A1 | 8/2006 |
| DE | 102005040324 A1 | 10/2006 |
| DE | 102008028868 A1 | 12/2009 |
| DE | 102014114572 A1 | 4/2016 |
| DE | 102017207030 A1 | 10/2018 |
| EP | 0934127 B1 | 9/2001 |
| EP | 01522895 B1 | 11/2006 |
| EP | 1614199 B1 | 1/2008 |
| JP | H11140617 A | 5/1999 |
| JP | H11172421 A | 6/1999 |
| JP | 2000147204 A * | 5/2000 |
| JP | 2003193231 A | 7/2003 |
| JP | 2004347860 A | 12/2004 |
| JP | 2005136393 A | 5/2005 |
| JP | 2007505220 A | 3/2007 |
| JP | 2009517852 A | 4/2009 |
| WO | 2009017634 A2 | 2/2009 |

OTHER PUBLICATIONS www.plasma.com, with English translation, "Why are parylenes so unique?", (2016)(downloaded Nov. 2018), 9 pages.

Sundberg et al, "Organic and inorganic-organic thin film structures by molecular layer deposition: A review", Beilstein Journal of Nanotechnology, (Jul. 2014), 34 pages.

Rix et al (2), "A microscopic model for long-term laser damage in calcium fluoride", Proc. of SPIE, vol. 7504 (2009), 10 pages.

Rix et al (1), "Formation of metallic colloids in CaF2 by Intense ultraviolet light", Applied Physics Letters 99, (Dec. 2011), 4 pages.

Natura et al, "Study of haze in 193 nm high dose irradiated CaF2 crystals", Proc of SPIE, vol. 7504, 2009), 8 pages.

Lee et al, "157 nm Pellicles (Thin Films) for Photolithography: Mechanistic Investigation of the VUV and UV-C Photolysis of Fluorocarbons", J. Am. Chem. Soc., May 2005, 8 pages.

H. Van Bui et al., Atomic and molecular layer deposition: off the beaten track, Che,. Commun., vol. 53 (2017), 27 pages.

Gorham, "A New, General Synthetic Method for the Preparation of Linear Poly-p-xylylenes" Journal of Polymer Science: Part A-1, vol. 4 (1966), pp. 3027-3039.

George et al., "Surface Chemistry for Molecular Layer Deposition of Organic and Hybrid Organic-Inorganic Polymers", Accounts of chemical research, Apr. 2008, 12 pages.

Eda et al., "Novel Fluoropolymers for Next Generation Lithographic Material", Reports Res. Lab. Asahi Glass Co., Ltd., 54 (2004), 8 pages.

French et al., "Novel hydrofluorocarbon polymers for use as pellicles in 157 nm semiconductor photolithography: fundamental of transparency" Journal of Fluorine Chemistry 122 (2003), pp. 63-80.

German Office Action with English translation, Application No. 10 2019 200 208.0, dated Jul. 18, 2019, 6 pages.

International Search Report, PCT/EP2019/083764, dated Feb. 19, 2020, 5 pages.

International Preliminary Report on Patentability, PCT/EP2019/083764, dated Jun. 16, 2021, 10 pages.

Japanese Office Action with English translation, JP Application No. 2021-540240, dated Aug. 23, 2022, 11 pages.

* cited by examiner

METHOD FOR IN-SITU DYNAMIC PROTECTION OF A SURFACE AND OPTICAL ASSEMBLY

CROSS-REFERENCE TO RELATED APPLICATION

This is a Continuation of International Application PCT/EP2019/083764, which has an international filing date of Dec. 5, 2019, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2019 200 208.0 filed on Jan. 10, 2019.

FIELD OF THE INVENTION

The invention relates to a method of in situ dynamic protection of a surface of an optical element from degradation, said optical element being disposed in an interior of an optical assembly for the FUV/VUV wavelength range. The invention also relates to an optical assembly for the FUV/VUV wavelength range, especially a lithography system, an inspection system or a beam source, comprising: an interior in which a surface of an optical element is disposed, and at least one metering apparatus for supply of a reactant to the interior.

BACKGROUND

For optical elements subjected to high stress in the far ultraviolet and vacuum ultraviolet (FUV/VUV) wavelength range at wavelengths between about 100 nm and about 280 nm, in particular for microlithography, fluorides are generally used as substrate material, especially fluorspar ($CaF_2$) and magnesium fluoride ($MgF_2$). Under irradiation with high intensities, even after only about $10^6$ pulses, the first damage appears on the surface of the $CaF_2$ material; cf. [1, 2]. As a result of the interaction with FUV/VUV radiation, local depletion of fluorine occurs in the bulk of the optical elements, resulting in the formation of Ca metal colloids (cf. [3]), which themselves serve as nuclei for massive degradation. Fluorine depletion occurs even faster at the surface, where the fluorine atoms released can escape into the environment.

For example, on the outside of a laser chamber window of an excimer laser, consisting of $CaF_2$, degradation in the form of a white powdery coating was observed at a laser energy density of more than 20 mJ/cm². By contrast, there was no damage on the inside of the laser chamber window that was in contact with the fluorine-containing laser gas, which suggests that fluorine is the crucial substance for avoiding the deposition of the powdery coating or degradation.

It has been found that the surface preparation or cleaning and subsequent sealing of the cleaned surface play an important role in order to increase radiation resistance of optical elements. Numerous solutions have been proposed for improvement of radiation resistance, and include, by way of example, the following:

Ultrasound cleaning or etching with subsequent UV and plasma cleaning (WO2009017634A2, DE102005040324A1 or the parallel US 2006/0046099A1 and U.S. Pat. No. 7,128,984B2), sealing with high-density metal fluoride layers that have been sputtered in a fluorine-containing atmosphere (US20050023131A1, JP2003193231A1), reactively deposited (JPH11172421A1) or have been aftertreated (US20040006249A1, JPH11140617A1, JP2004347860A1), sealing of optical elements (for example the outside of a laser chamber window) with oxides $Al_2O_3$ or $SiO_2$ or fluorinated $SiO_2$ (DE10350114B4, DE102006004835A1, EP1614199B1, US20030021015A1, US20040202225A1, U.S. Pat. No. 6,466,365B1, U.S. Pat. No. 6,833,949B2, U.S. Pat. No. 6,872,479B2), or the improvement of the adhesion of sealing oxide layers by a fluoridic adhesion promoter layer (U.S. Pat. No. 8,399,110 B2).

All these approaches either require corrosive materials, for example fluorine-containing materials, or have other unwanted side-effects, for example increased absorption.

SUMMARY

It is an object of the invention to provide a method of in situ dynamic protection of a surface and an optical assembly that enables such dynamic protection.

According to one formulation, this object is achieved by a method of the type specified at the outset, comprising: supplying at least one gaseous or volatile fluorine compound or fluorine-containing compound to the interior for dynamic deposition of a fluorine-containing protective layer, especially a protective fluoropolymer layer, on the surface of the optical element.

The inventors have observed that a fluorine-containing protective layer or a fluorine-containing coating, especially a protective fluoropolymer layer, does have protective action in respect of the surface of the optical element, but that this protective action is not sustained, because the material of the fluorine-containing protective layer gradually evaporates or becomes detached as the optical element is irradiated with FUV/VUV radiation.

What is therefore proposed in accordance with one aspect of the invention is (dynamic) deposition of the fluorine-containing protective layer on an optical element in situ, i.e. in the installed state in an optical assembly for the FUV/VUV wavelength range. In this way, the protective layer is constantly (or at least periodically) renewed, which, in turn, prevents virtually complete evaporation of the protective layer in the course of operation of the optical assembly and any associated loss of its protective action. The protective layer should have minimum absorption for the FUV/VUV radiation, in order to prevent possible thermal effects of the protective layer on the optical element. It is generally likewise unfavorable if the thickness of the protective layer is too great.

The dynamic protection of the surface is advantageously achieved in that, for a particular thickness or a particular thickness interval of the protective layer, a stable equilibrium is established between the deposition of the protective layer and the evaporation of the protective layer by the irradiation of the protective layer with FUV/VUV radiation. The thickness of the fluorine-containing protective layer can optionally be adjusted in a similar manner to that described in EP1522895B1, which discloses a method and an apparatus for provision of a mirror with a dynamic protective layer, in order to protect the mirror from etching with ions.

In one variant, the fluorine-containing protective layer is deposited on the surface layer by layer via a molecular layer deposition process. For dynamic protection, only low layer thicknesses of the fluorine-containing protective layer of a few atomic or molecular layers are required, which are constantly renewed in the operation of the optical assembly. Molecular layer deposition enables production of ultrathin (fluoro)polymer layers on the surface, as described, for example, in [7, 8] or in US2012/121932A1, each of which is incorporated into the present application by reference in their respective entireties.

The method of molecular layer deposition is similar to atomic layer deposition, in which the deposition is effected via two or more self-limiting surface reactions that are performed cyclically. If the surface reactions deposit molecular fragments rather than individual atoms of the reactants in a self-limiting reaction, this is referred to as molecular layer deposition; cf [8].

In a development, the fluorine-containing gas comprises a fluorine-containing reactant for the molecular layer deposition process that is supplied to the interior in a pulsed manner. In a first surface reaction step of the molecular layer deposition process, the fluorine-containing reactant can be deposited on the surface or on a second reactant (see below) and enter into a self-limiting chemical reaction therewith. After a subsequent purge or evacuation step in which unreacted reactant gas and reaction products are removed from the interior, a further process step may follow, in order to reactivate the surface for the first reaction step. The second process step may be a self-limiting chemical reaction of a further reactant, but it is also possible that another process step, for example a plasma treatment, is performed in order to reactivate the surface for the self-limiting reaction of the first reactant. The second process step is followed by a further purge or evacuation step in order to purge the interior. These four or possibly more process steps are generally conducted in cyclical succession, with repetition of the (reaction) cycle in order to deposit the protective layer with a desired layer thickness. As described further above, layer growth under suitably chosen reaction conditions is self-limiting, i.e. the amount of layer material deposited in each reaction cycle is constant.

In a further development, the interior is supplied with a further reactant for the molecular layer deposition process in a pulsed manner. The further (gaseous) reactant may likewise contain fluorine, but this is not absolutely necessary. If the molecular layer deposition process deposits a fluoropolymer, the reactant and the further reactant may, for example, be molecular constituents of radiation-resistant fluorinated or perfluorinated polymers that have low absorption for the FUV/VUV wavelength range. The first and second reactants may, for example, form monomers or oligomers of a copolymer which is deposited on the surface.

Suitable materials for the fluorine-containing protective layer are especially fluorinated or perfluorinated polymers that are used as pellicles for protection of lithography masks in lithography applications at wavelengths in the range of 157 nm or of 193 nm; cf. [4-6], U.S. Pat. No. 6,824,930B2, U.S. Pat. No. 7,300,743B2, U.S. Pat. No. 7,402,377B2 or U.S. Pat. No. 7,438,995B2, all of which are incorporated into this application in their entirety by reference.

In an alternative variant, the fluoropolymer layer is deposited on the surface in the form of a fluorinated parylene layer. (Fluorinated) parylenes are organic polymers in the form of (fluorinated) poly(p-xylylenes). The parylene layer or parylenes are typically produced by evaporating or subliming a parylene dimer in the form of paracyclophane or di-p-xylylene, and splitting it by pyrolysis into monomers (quinodimethane or p-xylylene), which are deposited on the comparatively cold surface in the form of a parylene polymer; cf. [9, 10] and "https://www.plasma.com/cs/plasmatechnik/parylene-beta-version/technologie/". The fluorinated parylenes may, for example, be parylene F-VT4 and/or parylene F-AT4, the chemical structural formulae of which can be called up, for example, using the link given above.

In a development, the interior is supplied with a (gaseous) fluorinated parylene monomer. The supply of a parylene monomer to the interior has been found to be favorable since, in this case, the pyrolysis of the dimer, which is typically conducted at temperatures of more than 600° C., can be performed outside the interior, for example, in a gas supply or pyrolysis chamber which is heatable for this purpose. The heating device provided may, for example, be a resistance heater in the gas supply. The parylene monomer supplied to the interior is deposited at the surface of the optical element, since this typically has a comparatively low temperature, for example room temperature. Other components in the interior, for example chamber walls, sensors, holders etc., may optionally be heated in order to prevent deposition of a parylene layer on these components.

For support of the polymerization reaction of the parylene monomer, it is possible to use pulsed plasma, as described in EP0934127B1, which is incorporated into this application in its entirety by reference. The deposition of the protective parylene layer and the plasma treatment can be performed simultaneously or successively. For the plasma treatment, a plasma source may be mounted within the interior. It is also possible to use (pulsed) FUV/VUV radiation to support the polymerization reaction.

Especially for the application of the protective parylene layer, it is favorable when the pressure in the interior is comparatively low and is less than about 0.1 mbar. In this way, it is possible to reduce the risk that contaminating substances will be deposited on the surface.

In a further alternative variant, the protective fluoropolymer layer is deposited directly on the surface. It has been found that a protective layer of amorphous fluoropolymers such as Teflon AF from DuPont has good protective action in respect of the surface, but is evaporated or removed comparatively quickly, especially in the case of the irradiation with wavelengths of about 157 nm, for example. In the case of direct deposition of the fluoropolymer from the gas phase, no chemical reaction of the fluoropolymer takes place; instead, it is deposited directly on the surface from the gas phase. Other fluoropolymers containing polytetrafluoroethene typically also have good protective action in respect of the surface.

In one variant, the gaseous or volatile fluorine-containing compound is supplied during an operation pause of the optical assembly. In particular, the entire deposition process can be performed during the operation pauses of the optical assembly. In this way, it is possible to avoid any disruptive interaction of the FUV/VUV radiation present in operation of the optical assembly with the fluorine-containing compound or with the reactant(s) for the molecular layer deposition process. During an operation pause, it is for example possible to effect transport or exchange of an object which is being inspected with the aid of the optical assembly (for example a mask or a wafer) or which is being exposed with the aid of the optical assembly (for example a wafer).

In an alternative variant, supply of the volatile fluorine-containing compound is conducted at least during an irradiation of the optical element with FUV/VUV radiation. In this case, the deposition of the protective layer is performed in the course of operation of the optical assembly (and optionally additionally in the operation pauses). In this case, the FUV/VUV radiation present in any case in the optical assembly can be used for the activation of the reaction that takes place in the course of deposition of the protective layer.

In a further variant, the fluorine-containing protective layer is deposited until a thickness of more than 1 nm is attained, or the fluorine-containing protective layer is kept at a thickness of more than 1 nm. As described further above, the fluorine-containing protective layer can be deposited solely during the operation pauses of the optical assembly. With the aid of measurements conducted beforehand, it is possible to choose or adjust the deposition rate, for example in the molecular layer deposition process, such that a thickness of the fluorine-containing protective layer of more than about 1 nm is established after each operation pause.

If the molecular layer deposition process is performed at least partly during the operation of the optical assembly, the application rate can likewise be adjusted or adapted to the rate of removal of the protective layer by evaporation so as to establish a dynamic equilibrium in which the thickness of the protective layer permanently does not drop below the abovementioned value. The rate of evaporation of the fluorine-containing protective layer depends on the intensity of the FUV/VUV radiation and can likewise be measured beforehand in order to suitably adjust the dynamic equilibrium between the deposition rate and the evaporation rate of the fluorine-containing protective layer.

A further aspect of the invention relates to an optical assembly for the FUV/VUV wavelength range of the type specified at the outset, in which the metering apparatus for supply of a volatile fluorine-containing compound to the interior is designed for dynamic deposition of a fluorine-containing protective layer on the surface of the optical element. For supply of the gaseous fluorine-containing compound (also called "precursor") to the interior, the optical assembly typically has a metering apparatus with a gas inlet. The metering apparatus may also comprise a temperature control device, especially a heating device, in order to heat the compound, optionally to the temperature at which the vapor pressure is sufficiently high for the coating process.

In one embodiment, the metering apparatus is designed for pulsed supply of the reactant for a molecular layer deposition process to the interior, in order to deposit the fluorine-containing protective layer on the surface layer by layer in the form of a protective fluoropolymer layer. The metering apparatus in this case is a controllable inlet that typically has a valve for pulsed supply of the reactants for the molecular layer deposition process and of purge gases that are required in the molecular layer deposition process.

In a further embodiment, the metering device is designed for supply of a fluorinated parylene monomer to the interior. As described further above, the parylene monomer is deposited at and polymerizes on the surface of the optical element, forming a fluorinated parylene polymer layer.

In one development, the metering device has a heatable gas supply or a temperature control device for production of the fluorinated parylene monomer by pyrolysis of a fluorinated parylene dimer. The heatable gas supply may, for example, have a resistance heater in order to generate temperatures of typically more than about 600° C., in order to enable the pyrolysis of the parylene dimer. The optical assembly or the metering apparatus may additionally have an evaporator in order to sublime or to evaporate the fluorinated parylene dimer which is in pulverulent form, for example, for which it is possible to use lower temperatures than in the case of pyrolysis, these being in the order of magnitude between about 100° C.-150° C., for example.

In a further embodiment, the metering apparatus is designed to supply a fluoropolymer for direct deposition on the surface of the optical element. This metering apparatus may have an evaporator, for example, in which the fluoropolymer is present, and it is converted to the gas phase. In this case, the fluoropolymer which is supplied to the interior is deposited directly from the gas phase on the surface of the optical element, i.e. there is no chemical reaction of the fluoropolymer within the interior. This is possible, for example, in the case of deposition of Teflon AF from DuPont for formation of a protective layer, but also in the case of other fluoropolymers.

In a further embodiment, the optical assembly comprises a vacuum pump for generation of a pressure in the interior which is less than 0.1 mbar. As described further above, it is favorable when the fluorine-containing protective layer, especially the parylene layer, is deposited in a (moderate) vacuum.

In a further embodiment, the surface of the optical element is formed from a fluoride, especially from a metal fluoride. The fluoride may, for example, be $CaF_2$ or $MgF_2$. In the case of these and other fluoride materials, irradiation with radiation at wavelengths in the FUV/VUV wavelength range leads to fluorine depletion, especially in the region of the surface, that can result in degradation of the surface. The optical element, the surface of which is to be protected, is generally a transmissive optical element, for example a lens element, a planar plate, etc. It is optionally also possible to protect a reflective optical element from degradation with a dynamic fluorine-containing protective layer.

Further features and advantages of the invention will be apparent from the description of working examples of the invention that follows, with reference to the figures of the drawing that show the details important to the invention, and from the claims. The individual features may each individually be implemented singly or multiply in any combination in one variant of the invention.

BRIEF DESCRIPTION OF THE DRAWINGS

Working examples are shown in the schematic drawing and are elucidated in the description that follows. The figures show.

DETAILED DESCRIPTION

In the description of the drawings that follows, identical reference signs are used for components that are the same or have the same function.

Figure 1:
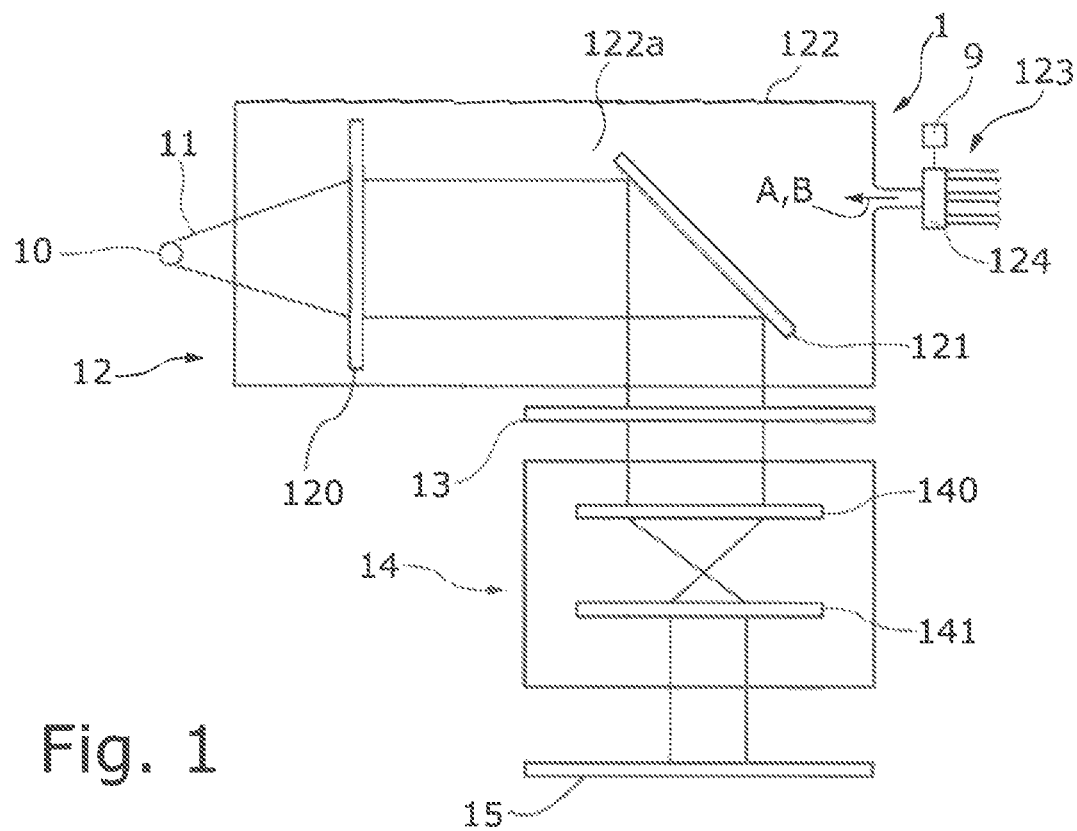
FIG. 1 a schematic diagram of an optical assembly in the form of an FUV/VUV lithography system, FIG. 2 a schematic diagram of an optical assembly in the form of a wafer inspection system, FIGS. 3A and 3B schematic diagrams of respective first and second reaction steps of a molecular layer deposition process, and FIG. 4 a schematic diagram of an optical element in the form of a planar plate with a fluorine-containing protective layer applied on one side of the optical element.

FIG. 1 shows a schematic of an optical assembly 1 in the form of an FUV/VUV lithography system, especially for wavelengths in the FUV/VUV wavelength range between about 110 nm and about 280 nm. The FUV/VUV lithography system 1 has, as primary constituents, two optical systems in the form of an exposure system 12 and a projection system 14. For the performance of an exposure process, the FUV/VUV lithography system 1 has a radiation source 10, which may, for example, be an excimer laser which emits VUV radiation 11 at a wavelength in the VUV wavelength range of, for example, 193 nm, 157 nm or 126 nm, and which may be an integral part of the FUV/VUV lithography system 1.

The FUV/VUV radiation 11 emitted by the radiation source 10 is processed with the aid of the exposure system 12 such that it can be used to illuminate a mask 13, also called reticle. In the example shown in FIG. 1, the exposure system 12 has both transmissive and reflective optical elements. In a representative manner, FIG. 1 shows a transmissive optical element 120 which focuses the FUV/VUV radiation 11, and a reflective optical element 121 which, for example, deflects the FUV/VUV radiation 11. In a known manner, it is possible to combine a wide variety of different transmissive, reflective or other optical elements with one another in the exposure system 12 in any manner, including a relatively complex manner. The transmissive optical element 120 and the reflective optical element 121 are disposed in an interior 122a of a housing 122 of the exposure system 12.

The mask 13 has, on its surface, a structure which is transferred to an optical element 15 to be exposed, for example a wafer, with the aid of the projection system 14 in the context of production of semiconductor components. In the example shown, the mask 13 is designed as a transmissive optical element. In alternative embodiments, the mask 13 may also be designed as a reflective optical element. The projection system 14 has at least one transmissive optical element in the example shown. The example shown illustrates, in a representative manner, two transmissive optical elements 140, 141, which serve, for example, to reduce the structures on the mask 13 to the size desired for the exposure of the wafer 15. In the case of the projection system 14 as well, it is possible for reflective optical elements among others to be provided, and for any optical elements to be combined with one another as desired in a known manner. It should also be pointed out that optical assemblies without transmissive optical elements may also be used for FUV/VUV lithography.

Figure 2:
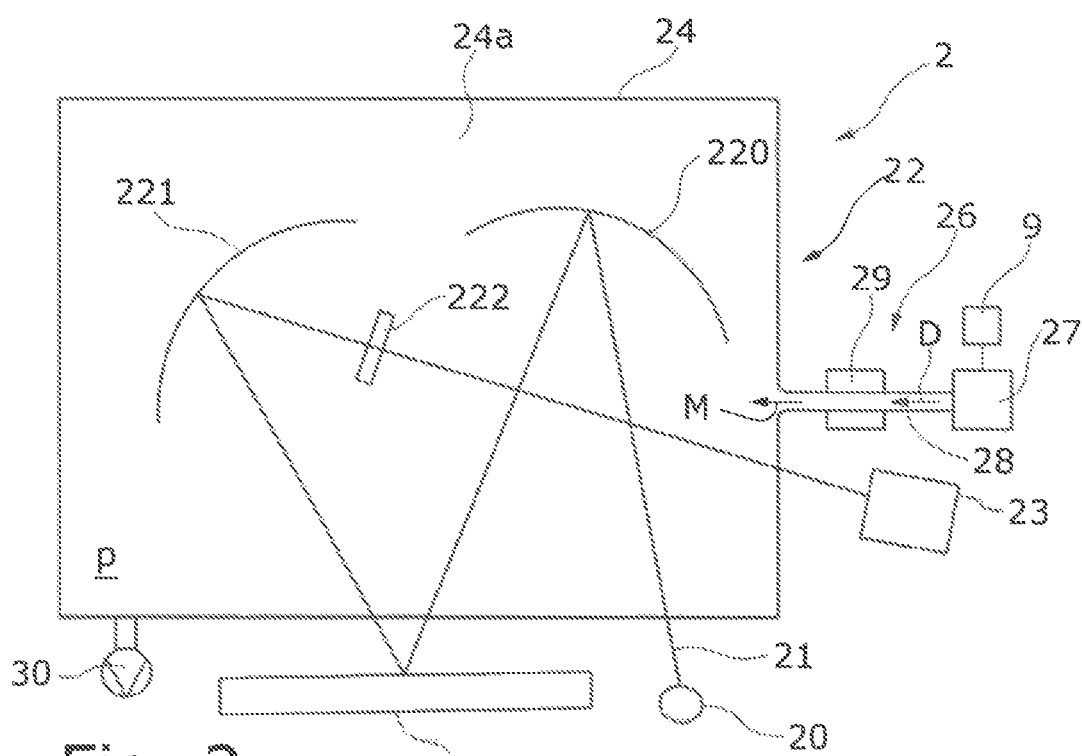

FIG. 2 shows a schematic of an illustrative embodiment of an optical assembly in the form of a wafer inspection system 2. The explanations that follow are also analogously applicable to inspection systems for inspection of masks.

The wafer inspection system 2 has a radiation source 20, the FUV/VUV radiation 21 of which is steered onto a wafer 25 via an optical system 22. For this purpose, the radiation 21 is reflected onto the wafer 25 by a concave mirror 220. In the case of a mask inspection system 2, it would be possible to dispose a mask to be examined in place of the wafer 25.

The radiation reflected, diffracted and/or refracted by the wafer 25 is guided onto a detector 23 for further evaluation by a further concave mirror 121 that likewise forms part of the optical system 22 via a transmissive optical element 222. The transmissive optical element 222 is shown schematically in FIG. 2 as a planar plate, but may also have a different geometry. For example, the transmissive optical element 222 may be a lens element having at least one curved surface. The transmissive optical element 222 may also be disposed in the wafer inspection system 2 at a position other than that shown in FIG. 2. The optical system 22 of the wafer inspection system 2 has a housing 24, in the interior 24a of which are disposed the two reflective optical elements or mirrors 220, 221 and the transmissive optical element 222.

The radiation source 20 may, for example, be exactly one radiation source or a combination of multiple individual radiation sources, in order to provide a predominantly continuous radiation spectrum. In modifications, it is also possible to use one or more narrowband radiation sources 20. The wavelength or wavelength band of the radiation 21 generated by the radiation source 20 is preferably in the FUV/VUV wavelength range between 100 nm and 280 nm, particularly preferably in the wavelength range between 110 nm and 190 nm.

Figure 3A:
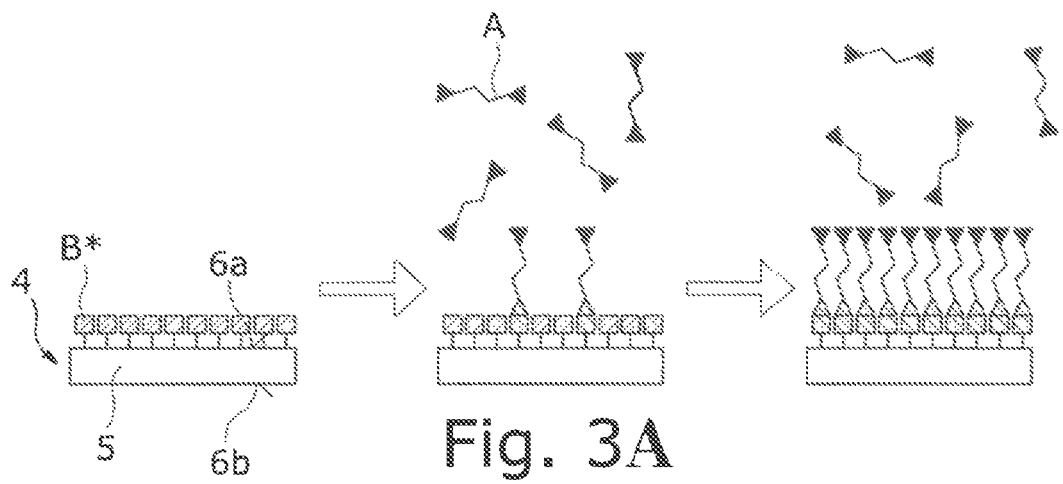
Figure 3B:
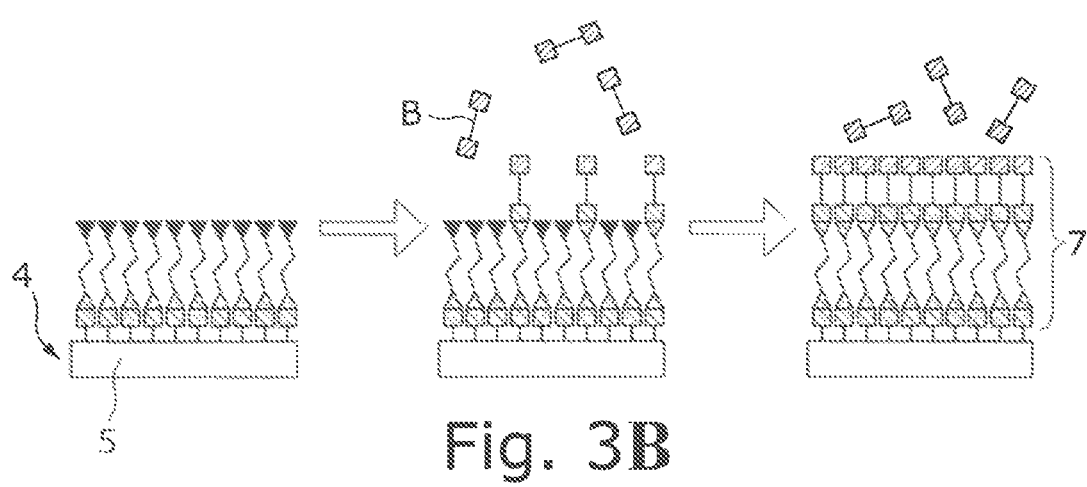

FIGS. 3A and 3B show an optical element 4 which is designed for transmission of radiation 11, 21 in the FUV/VUV wavelength range and which can form, for example, one of the transmitting optical elements 120, 140, 141, 222 of FIG. 1 or of FIG. 2. The optical element 4 shown in FIGS. 3A and 3B is shown in highly schematic form as a planar plate, but this may also be a lens element or another kind of transmissive optical element. The optical element 4 has a substrate 5, which is $CaF_2$ in the example shown. The substrate 5 may alternatively be a different material, for example a fluoride, especially a metal fluoride. The substrate 5 has a respective planar surface 6a, 6b on its front side and on its reverse side, which is exposed to the environment in the interior 122a, 24a and which is irradiated by the FUV/VUV radiation 11, 21 from the respective radiation source 10, 20 that passes through the optical element 4.

On irradiation of the surface 6a, 6b with intense FUV/VUV radiation 11, 21, this interacts with the material of the substrate 5 and generates (local) fluorine depletion that can lead to severe degradation of the fluoride material of the substrate 5, especially in the region of the respective surface 6a, 6b. In principle, it is possible to apply a fluorine-containing protective layer to the surface 6a, 6b, in order to reduce or very substantially prevent degradation. The fluorine-containing protective layer may, for example, be a protective layer of a fluorinated or perfluorinated polymer. However, it has been found that, in the case of irradiation with FUV/VUV radiation 11, 21, a fluorine-containing protective polymer layer evaporates gradually, such that it is virtually no longer present after a certain operating time of the optical assembly 1, 2, such that the surface 6a, 6b is exposed to the environment and undergoes the above-described degradation as a result of the irradiation with the FUV/VUV radiation 11, 21.

In order nevertheless to prevent the degradation of the surface 6a, 6b, in the example shown in FIGS. 3A and 3B, a fluorine-containing protective layer 7 is deposited dynamically on the surface 6a on the front side of the substrate 5. It will be apparent that the dynamic protective layer 7 is correspondingly also deposited on the second surface 6b on the reverse side of the substrate 5, which is not shown pictorially for simplification.

In the example shown in FIGS. 3A and 3B, the protective layer 7 is deposited on the surface 6a in situ, i.e. in the installed state of the respective optical element 120, 140, 141, 222 in the optical assembly 1, 2, specifically layer by layer through a molecular layer deposition process. The molecular layer deposition process, analogously to the atomic layer deposition process, is a cyclical, self-limiting process. In the molecular layer deposition process, in a first reaction step shown in FIG. 3A, the interior 122a of the FUV/VUV lithography system 1 is supplied in a pulsed manner with a first reactant A in the form of a first molecular fragment via a metering apparatus 123 having a gas inlet. The metering apparatus 123 shown in highly schematic form in FIG. 1 enables a controllable, pulsed supply of gases to the interior 122a, and has a controllable valve 124 for that purpose. The first reactant A, more specifically a functional group of the first reactant A, reacts with a constituent B* (a functional group) of a second reactant B adsorbed on the surface 6a, i.e. enters into a chemical compound with the adsorbed constituent B* and is deposited on the surface 6a. Since the first reactant A does not react with itself, the first reaction step is complete as soon as a layer of the first reactant A has been deposited on the surface 6a, i.e. the first reaction step is self-limiting. The first reaction step is followed by a purge step in which the excess fraction of the first reactant A that has not been deposited on the surface 6a is removed from the interior 122a with the aid of an inert purge gas, for example in the form of nitrogen. For the extraction of the purge gas, the housing 122 is connected to a pump (not shown pictorially) or to a gas outlet.

In a second reaction step of the molecular layer deposition process, shown in highly schematic form in FIG. 3B, the second reactant B is supplied to the interior 122a via the metering apparatus 123. A functional group of the second reactant B enters into a chemical compound here with a functional group of the first reactant A, such that the second reactant B is deposited on the surface 6a. The chemical reaction of the second reactant B is self-limiting as well, meaning that the second reaction step is complete as soon as a layer of the second reactant B has been deposited. The second reaction step is also followed by a purge step in which the excess fraction of the second reactant B that has not been deposited on the surface 6a or become associated with the first reactant A is removed from the interior 122a with the aid of an inert purge gas, for example in the form of nitrogen. After the deposition process shown in FIGS. 3A and 3B, a molecular layer of a protective layer 7 composed of a chemical compound of the reactants A, B has been deposited on the surface 6a of the optical element 4.

The method steps of the molecular layer deposition process that are described further above are generally repeated until a protective layer 7 having a desired thickness has been deposited on the surface 6a of the optical element 4 or of the substrate 5. The material of the protective layer 7 is a fluorine-containing material, typically a fluoropolymer, that firstly has high resistance to irradiation with the FUV/VUV radiation 11, 21 and secondly has minimum absorption for the FUV/VUV radiation 11, 21 in order to avoid thermal effects.

The two reactants A, B, or the material of the protective fluoropolymer layer 7, may, for example, be a polymer material which is used for the production of pellicles for lithography applications in the FUV/VUV wavelength range, since these materials generally have high radiation resistance and comparatively low absorption for FUV/VUV radiation 11, 21. The fluoropolymer may especially be a fluoropolymer in the form of "FPR" or "ASF", as described in [4], hydrofluorocarbon polymers, e.g. hydrogenated hydrofluorocarbon polymers as described in [5, 6] or in U.S. Pat. No. 7,300,743B2, or partly or fully fluorinated polymers as described in U.S. Pat. No. 6,824,930B1, for example fluorinated copolymers.

In the case of a protective layer 7 composed of a copolymer formed from two monomers, the molecular layer deposition can be effected in a particularly simple manner in that the first reactant A corresponds to the first monomer and the second reactant B to the second monomer of the copolymer. The first monomer may, for example, be hexafluoroisobutylene (reactant A), and the second monomer may be trifluoroethylene or fluoroethene (reactant B). It is not absolutely necessary for both the first reactant A and the second reactant B to contain fluorine. The protective layer may also be formed from a fluoropolymer in the form of a homopolymer or copolymer, which takes the form as described in U.S. Pat. No. 7,438,995B2, i.e. that of a homopolymer of group A described therein, or of a copolymer of groups B, C and D described therein. The protective layer 7 may also be formed from perfluoro-n-alkanes, as described in U.S. Pat. No. 7,402,377B2.

In the example shown in FIG. 2, a protective fluoropolymer layer 7 in the form of a fluorinated parylene layer is deposited on the optical element 222, more specifically on a surface (not shown pictorially in FIG. 2) of the optical element 22. For the deposition, the optical system 22 of FIG. 2 has a metering apparatus 26 that serves for supply of a fluorinated parylene monomer M to the interior 24a. The fluorinated parylene monomer M is produced from a fluorinated parylene dimer D which is converted to the gas phase from a fluorinated parylene dimer powder in an evaporator 27. For this purpose, the fluorinated parylene dimer is heated to a temperature of about 130° C. in the evaporator 27 and sent to a gas supply 28 in the form of a supply pipe.

The metering apparatus 26 has a heating device 29 in the form of a resistance heater in order to heat the fluorinated parylene dimer D that flows through the gas supply 28 to a temperature of more than about 600° C. This pyrolyzes the parylene dimer D, forming the fluorinated parylene monomer M that gets into the interior 24a. The parylene monomer M is deposited on the comparatively cold surface of the optical element 222, the temperature of which is about room temperature (about 25° C.). In the course of deposition, the parylene monomer M polymerizes and forms the fluorinated protective parylene layer 7. The fluorinated parylene of the protective parylene layer 7 may, for example, be parylene F-VT4 or parylene F-AT4.

In order to avoid impurities in the deposition of the protective parylene layer 7, it has been found to be favorable when there is a comparatively low pressure p of, for example, less than about 0.1 mbar in the interior 24a. In order to generate this pressure p, the inspection system 2 has a vacuum pump 30. It will be apparent that a low pressure p in the interior 122a may also be advisable in the case of the molecular layer deposition of the fluorine-containing protective layer 7 described further above in association with FIG. 1. Accordingly, the FUV/VUV lithography system 1 of FIG. 1 may also have a vacuum pump 30 for reducing the pressure in the interior 122a.

Figure 4:
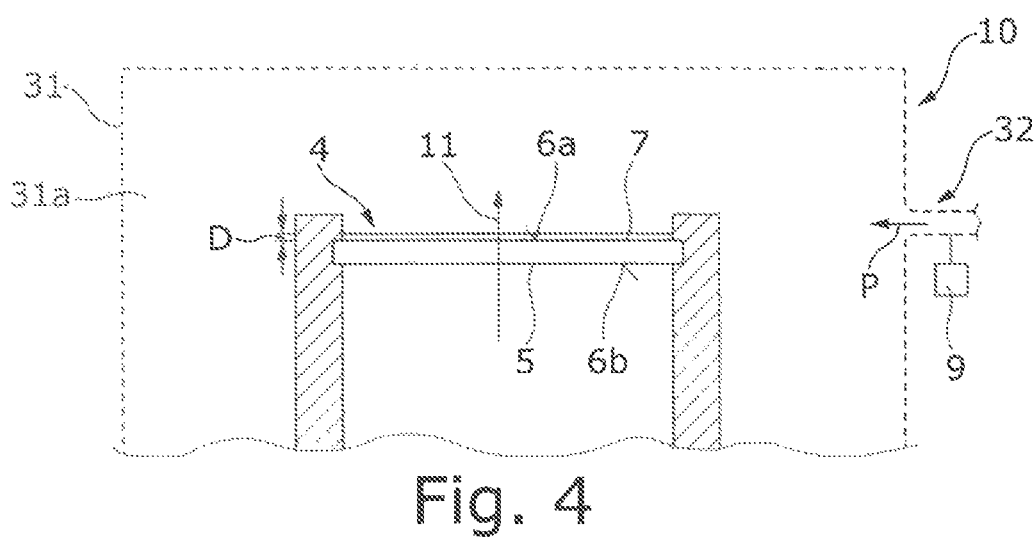

FIG. 4 shows an example of an optical element 4 in the form of a plane-parallel plate having a substrate 5 composed of $CaF_2$. The optical element 4 forms a discharge chamber window of the radiation source 10 in the form of the excimer laser of FIG. 1, having a gas mixture, for example a fluorine-containing gas mixture, introduced into the resonator zone thereof. As apparent in FIG. 4, the fluorine-containing protective layer 7 is formed at a surface 6a of the optical element 4, which is outside the housing of the discharge chamber of the excimer laser 10. The laser radiation 11 from the excimer laser 10 with a wavelength of 157 nm passes through the optical element 4. The discharge chamber and hence the surface 6a of the optical element 4 is within a housing 31 (shown by a dotted line) of the excimer laser 10, which has an interior 31a. A metering apparatus 32 is formed within the housing 31, via which the interior 31a in the example shown is supplied with a gaseous fluoropolymer P, which is Teflon AF from DuPont, and this is deposited on the surface 6a of the optical element 4. The inside of the optical element 4 is in a fluorine-containing atmosphere and is therefore significantly more resistant to radiation, such that no (fluorine-containing) protective layer is required on the surface 6b present therein. In the case of deposition of the gaseous fluoropolymer P, the example shown in FIG. 4 is a direct deposition from the gas phase, i.e. the fluoropolymer supplied to the interior 31a via the metering apparatus 32 is deposited on the surface 6a of the optical element 4 directly, i.e. without entering into a chemical reaction.

In all examples described further above, it is typically sufficient when the protective layer 7 has a thickness D which is comparatively small, i.e. comprises just a few molecular layers, in order to achieve the desired protective effect. The thickness D of the protective layer 7 should especially not be too great, for example not greater than 100 nm, in order to minimize absorption.

In order to adjust the thickness D of the protective layer 7, the FUV/VUV lithography system 1 shown in FIG. 1, the wafer inspection system 2 shown in FIG. 2 and the excimer laser 10 shown in FIG. 4 each have a control device 9 that acts on the respective metering apparatus 123, 26, 32. The control device 9 enables adaptation of the deposition rate of the protective layer 7 to the evaporation rate in the course of irradiation of the protective layer 7 with FUV/VUV radiation 11, 12 so as to establish a dynamic equilibrium, such that the thickness D of the protective layer 7 remains basically constant. For the control of the deposition rate, it is possible to adjust the cycle of molecular layer deposition in the FUV/VUV lithography system 1 shown in FIG. 1 with the aid of the controllable valve 124. Correspondingly, it is also possible in the metering apparatus 26 shown in FIG. 2 to adjust the deposition rate by the action of the control device 9 on the evaporator 27. The control device 9 of the metering apparatus 32 shown in FIG. 4 also enables the adjustment of the deposition rate of the protective layer 7 by adjusting the feed rate of the gaseous fluoropolymer P into the interior 31a with the aid of a valve (not shown pictorially).

The protective layer 7 can in principle be deposited during the operation pauses of the respective optical assembly 1, 2, 10, in order to avoid any influence of the deposition of the protective layer 7 by the FUV/VUV radiation 11, 12. For example, the protective layer 7 can be deposited during a respective operation pause until it has a thickness D greater than a defined threshold value of 1 nm for example.

Alternatively, the deposition of the protective layer 7 and hence the supply of the respective fluorine-containing compound A, B, M, P can (also) be effected during the operation of the respective optical assembly 1, 2, 10, in which the optical element 120, 140, 141, 222, 4 is irradiated with the FUV/VUV radiation 11, 12. It can be beneficial here in some cases that the (pulsed) FUV/VUV radiation 11, 12 promotes or activates the respective reaction. In this case, the thickness D of the protective layer 7 can optionally be kept permanently within a defined thickness interval or above a threshold value for the thickness D of about 1 nm for example.

For promotion of the respective chemical reaction, especially the polymerization reaction on deposition of the fluorinated parylene monomer M on the surface 6a of the fluorine-containing protective layer 7, the deposition of the protective layer 7 can be effected in a plasma-assisted manner. For example, for this purpose, a plasma source may be disposed within the respective interior 122a, 24a, 31a, which generates a preferably pulsed plasma in the proximity of the respective surface 6a.

It will be apparent that the molecular layer deposition process that has been described further above in association with the FUV/VUV lithography system 1 of FIG. 1 can also be performed in the case of the inspection system 2 of FIG. 2 or in the case of the excimer laser 10 of FIG. 4. Correspondingly, in the case of the FUV/VUV lithography system 1 of FIG. 1 and the excimer laser 10 of FIG. 4, it is possible to deposit a protective layer 7 in the form of a fluorinated parylene. It is of course also possible for the direct deposition of a fluoropolymer, for example in the form of Teflon AF or another suitable fluoropolymer, to be effected in the case of the optical assemblies 1, 2 described in FIG. 1 and FIG. 2 as well.

In summary, in the manner described above, it is possible to avoid degradation of a respective optical element 120, 140, 141, 222, 4 by the dynamic deposition of the fluorine-containing protective layer 7.

REFERENCES

[1] Ute Natura, Stephan Rix, Martin Letz, Lutz Parthier, "Study of haze in 193 nm high dose irradiated $CaF_2$ crystals", Proc. SPIE 7504, Laser-Induced Damage in Optical Materials: 2009, 75041P (2009).

[2] S. Rix, U. Natura, F. Loske, M. Letz, C. Felser, and M. Reichling, "Formation of metallic colloids in $CaF_2$ by intense ultraviolet light", Applied Physics Letters 99 (26) 261909 (2011).

[3] S. Rix, U. Natura, M. Letz, C. Felser, L. Parthier, "A microscopic model for long-term laser damage in calcium fluoride", Proc. SPIE 7504, Laser-Induced Damage in Optical Materials, 75040J (2009).

[4] M. Eda, Y. Kawaguchi, T. Sasaki, Y. Takebe and O. Yokokoji, "Novel Fluoropolymers for Next Generation Lithographic Material", Reports Res. Lab. Asahi Glass Co., Ltd., 54, 41-48 (2004).

[5] K. Lee et al., "157 nm Pellicles for Photolithography", J. Am. Chem. Soc. 127, 8320-8327 (2005).

[6] R. French et al., "Novel hydrofluorocarbon polymers for use as pellicles in 157 nm semiconductor photolithography", Journal of Fluorine Chemistry 122 63-80 (2003).

[7] P. Sundberg and M. Karppinen "Organic and inorganic-organic thin film structures by molecular layer deposition", Beilstein J. Nanotechnol. 5, 1104-1136 (2014).

[8] S. M. George, B. Yoon, and A. Dameron, "Surface Chemistry for Molecular Layer Deposition of Organic and Hybrid Organic-Inorganic Polymers", Accounts of Chemical Research 42 (4), 498-508 (2009).

[9] Chow, S. W., Loeb, W. E. and White, C. E., "Poly ($\alpha,\alpha,\alpha',\alpha'$-tetrafluoro-p-xylylene)", Journal of Applied Polymer Science 13 (9) 2325-2332 (1969).

[10] Gorham, W. F., "A New, General Synthetic Method for the Preparation of Linear Poly-p-xylylenes", Journal of Polymer Science Part A-1: Polymer Chemistry, 4 (12) 3027-3039 (1966).

What is claimed is:

1. A method of in situ dynamic protection of a surface of an optical element from degradation, comprising:
disposing the optical element in an interior of an optical assembly configured to operate in a far-ultraviolet/vacuum ultraviolet (FUV/VUV) wavelength range, and
supplying at least one volatile fluorine-containing compound to the interior for dynamically depositing a fluorine-containing protective layer on the surface of the optical element,
wherein the fluorine-containing protective layer is deposited on the surface layer by layer via a molecular layer deposition process,
wherein the at least one volatile fluorine-containing compound comprises a fluorine-containing reactant for the molecular layer deposition process that is supplied to the interior in a pulsed manner, and
wherein a further reactant for the molecular layer deposition process is supplied to the interior in a pulsed manner, and wherein the fluorine-containing protective layer is deposited on the surface as a protective fluoropolymer layer.

2. The method as claimed in claim 1, wherein the protective fluoropolymer layer is deposited on the surface as a fluorinated parylene layer.

3. The method as claimed in claim 2, wherein the at least one volatile fluorine-containing compound supplied to the interior comprises a fluorinated parylene monomer.

4. The method as claimed in claim 1, further comprising generating a pressure of less than 0.1 mbar in the interior.

5. The method as claimed in claim 1, wherein the protective fluoropolymer layer is deposited directly on the surface.

6. The method as claimed in claim 1, wherein said supplying of the at least one volatile fluorine-containing compound is performed in an operating pause of the optical assembly.

7. The method as claimed in claim 1, wherein said supplying of the at least one volatile fluorine-containing compound is performed during irradiation of the optical element with FUV/VUV radiation.

8. The method as claimed in claim 1, wherein the fluorine-containing protective layer is deposited until a thickness of the fluorine-containing protective layer of more than 1 nm is attained, or wherein the fluorine-containing protective layer is kept at a thickness of more than 1 nm.

9. An optical assembly configured to operate in a far-ultraviolet/vacuum ultraviolet (FUV/VUV) wavelength range, comprising:
    an assembly defining an interior in which a surface of an optical element is disposed, and
    at least one metering apparatus arranged to supply a reactant to the interior,
        wherein that the at least one metering apparatus is configured to supply a volatile fluorine-containing compound to the interior for dynamically depositing a fluorine-containing protective layer on the surface of the optical element,
    wherein the at least one metering apparatus is configured for pulsed supply of the volatile fluorine-containing compound as a reactant for a molecular layer deposition process to the interior, in order to deposit the fluorine-containing protective layer on the surface layer by layer, and
    wherein the at least one metering apparatus is configured to supply the volatile fluorine-containing compound to the interior for dynamically depositing the fluorine-containing protective layer as a protective fluoropolymer layer on the surface of the optical element.

10. The optical assembly as claimed in claim 9, wherein the at least one metering apparatus is configured to supply a fluorinated parylene monomer to the interior.

11. The optical assembly as claimed in claim 10, wherein the at least one metering apparatus has a heatable gas supply that generates the fluorinated parylene monomer by pyrolysis of a fluorinated parylene dimer.

12. The optical assembly as claimed in claim 9, further comprising:
    a vacuum pump configured to generate a pressure in the interior of less than 0.1 mbar.

13. The optical assembly as claimed in claim 9, wherein the surface of the optical element is formed on a substrate made of a fluoride.

14. The optical assembly as claimed in claim 13, wherein the surface of the optical element is formed on a substrate made of a metal fluoride.

15. The optical assembly as claimed in claim 9, configured as a lithography system, an inspection system or as a beam source configured for operation in the FUV/VUV wavelength range.

* * * * *

UNITED STATES PATENT AND TRADEMARK OFFICE
CERTIFICATE OF CORRECTION

| | |
|---|---|
| PATENT NO. | : 11,681,236 B2 |
| APPLICATION NO. | : 17/373020 |
| DATED | : June 20, 2023 |
| INVENTOR(S) | : Shklover et al. |

It is certified that error appears in the above-identified patent and that said Letters Patent is hereby corrected as shown below:

On the Title Page

Item [56], Page 2, Column 2, Line 11, delete "2009)," and insert -- (2009), --.

Signed and Sealed this
Twenty-eighth Day of November, 2023

Katherine Kelly Vidal
*Director of the United States Patent and Trademark Office*